US011811001B2

(12) United States Patent
Chen et al.

(10) Patent No.: US 11,811,001 B2
(45) Date of Patent: Nov. 7, 2023

(54) FORMING METHOD OF FLIP-CHIP LIGHT EMITTING DIODE STRUCTURE

(71) Applicant: Lextar Electronics Corporation, Hsinchu (TW)

(72) Inventors: Jih-Kang Chen, Hsinchu (TW); Shih-Wei Yang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 18/051,019

(22) Filed: Oct. 31, 2022

(65) Prior Publication Data
US 2023/0078065 A1 Mar. 16, 2023

Related U.S. Application Data (62) Division of application No. 17/027,685, filed on Sep. 21, 2020, now Pat. No. 11,515,447.

(30) Foreign Application Priority Data

Mar. 10, 2020 (CN) .......................... 202010159964.6

(51) Int. Cl.
| | |
|---|---|
| *H01L 33/14* | (2010.01) |
| *H01L 33/46* | (2010.01) |
| *H01L 33/52* | (2010.01) |
| *H01L 33/32* | (2010.01) |
| *H01L 33/38* | (2010.01) |
| *H01L 33/00* | (2010.01) |

(52) U.S. Cl.
CPC ............ *H01L 33/145* (2013.01); *H01L 33/46* (2013.01); *H01L 33/52* (2013.01); *H01L 33/0012* (2013.01); *H01L 33/32* (2013.01); *H01L 33/382* (2013.01); *H01L 2933/0016* (2013.01); *H01L 2933/0025* (2013.01)

(58) Field of Classification Search
CPC ....... H01L 33/145; H01L 33/56; H01L 33/52; H01L 33/0012; H01L 33/32; H01L 33/382; H01L 2933/0016; H01L 2933/0025
See application file for complete search history.

(56) References Cited

U.S. PATENT DOCUMENTS

| | | | |
|---|---|---|---|
| 8,525,204 | B2 | 9/2013 | Fukshima et al. |
| 8,653,540 | B2 | 2/2014 | Engl et al. |
| 8,686,429 | B2 | 4/2014 | Bergmann et al. |
| 8,866,175 | B2 | 10/2014 | Engl et al. |
| 9,343,637 | B2 | 5/2016 | Engl et al. |
| 10,164,143 | B2 | 12/2018 | Engl et al. |
| 2008/0061315 | A1* | 3/2008 | Hata ....................... H01L 33/42 257/E33.068 |

(Continued)

*Primary Examiner* — Mark W Tornow
(74) *Attorney, Agent, or Firm* — CKC & Partners Co., LLC (57) ABSTRACT

The forming method of a flip-chip light emitting diode structure includes the following steps. A first substrate including a first semiconductor layer, an active layer on the first semiconductor layer and a second semiconductor layer on the active layer is provided. A first current blocking layer is formed on the second semiconductor layer, in which the first current blocking layer has a plurality of interspaces. A reflective layer covering the interspaces is formed, in which the reflective layer has a plurality of recesses, and each of the recesses is corresponding to each of the interspaces. A second current blocking layer filling into the recesses is formed.

6 Claims, 12 Drawing Sheets

(56) References Cited

U.S. PATENT DOCUMENTS

| | | | |
|---|---|---|---|
| 2014/0167067 A1* | 6/2014 | Choi | H01L 33/32 |
| | | | 438/46 |
| 2018/0248078 A1* | 8/2018 | Kuo | H01L 33/145 |
| 2019/0027647 A1* | 1/2019 | Song | H01L 33/44 |
| 2021/0057607 A1* | 2/2021 | Lin | H01L 25/167 |
| 2021/0193868 A1* | 6/2021 | Chen | H01L 33/42 |

* cited by examiner

FORMING METHOD OF FLIP-CHIP LIGHT EMITTING DIODE STRUCTURE

CROSS-REFERENCE TO RELATED APPLICATION

This application is a Divisional application of the U.S. application Ser. No. 17/027,685, filed Sep. 21, 2020, which claims priority to China Application Serial Number 202010159964.6, filed Mar. 10, 2020, which are herein incorporated by reference.

BACKGROUND

Field of Invention

The present disclosure relates to a method of forming a flip-chip light emitting diode structure, particularly relates to a method of forming flip-chip light emitting diode structure with improved yield.

Description of Related Art

In recent years, light emitting diodes have been widely used in a variety of lighting devices and display devices due to their high directivity and low power consumption. A well-equipped light emitting diode, in addition to its setups of light emitting layer, often needs to be matched with a corresponding chip structure in order to increase output efficiency and improve the reliability of the light emitting diode, life-time, and so on.

In general, a reflective layer and a current blocking layer are often applied in a light emitting diode chip structure. The reflective layer is used to adjust the output direction of light and improve the light output efficiency of the light emitting diode. The current blocking layer is used to reduce the current crowding effect. However, the yield of the conventional flip-chip light emitting diode structure is not good. For example, the flip-chip light emitting diode structure is prone to form void defects between substrates during the bonding process, and void defects results in reduction of yield of the flip-chip light emitting diode.

Therefore, a manufacturing method with improved yield of the flip-chip light emitting diode is needed.

SUMMARY

A flip-chip light emitting diode structure according to various embodiments of the present invention includes a substrate, a first patterned current blocking layer, a second patterned current blocking layer, a first semiconductor layer, an active layer and a second semiconductor layer. The first patterned current blocking layer is disposed on the substrate. The second patterned current blocking layer is disposed on the first patterned current blocking layer, in which the first patterned current blocking layer and the second patterned current blocking layer are located on different planes, and patterns of the first patterned current blocking layer and patterns of the second current blocking layer are substantially complementary. The first semiconductor layer is disposed on the second patterned current blocking layer. The active layer is disposed on the first semiconductor layer. The second semiconductor layer is disposed on the active layer, in which electrical properties of the second semiconductor layer and the first semiconductor layer are different.

According to some embodiments of the present invention, the structure further includes a transparent conductive layer and a first electrode contact. The transparent conductive layer is disposed between the first semiconductor layer and the second patterned current blocking layer and the first electrode contact is disposed on the substrate and penetrating the first patterned current blocking layer, the second patterned current blocking layer, the transparent conductive layer, the first semiconductor layer and the active layer, in which a top surface of the first electrode contact contacts with the second semiconductor layer.

According to some embodiments of the present invention, the second patterned current blocking layer includes a first portion extending towards the second semiconductor layer and covering a sidewall of the transparent conductive layer, a sidewall of the first semiconductor layer and a sidewall of the active layer.

According to some embodiments of the present invention, the first patterned current blocking layer includes a second portion extending towards the second semiconductor layer and covering the first portion, in which the second portion is substantially conformal with the first portion; and the first electrode contact is separated at least by the first portion and the second portion from the transparent conductive layer, the first semiconductor layer and the active layer.

According to some embodiments of the present invention, the structure further includes a passive layer disposed between the substrate and the first patterned current blocking layer, and a portion of the passive layer is interposed between the first electrode contact and the second portion.

According to some embodiments of the present invention, the structure further includes a conductive layer and a reflective layer. The conductive layer is disposed between the first patterned current blocking layer and the substrate and the reflective layer is disposed between the transparent conductive layer and the conductive layer, in which the first patterned current blocking layer and the second patterned current blocking layer embedded in the reflective layer, and the first patterned current blocking layer contacts with the conductive layer, the second patterned current blocking layer contacts with the transparent conductive layer.

According to some embodiments of the present invention, the second portion further covers a sidewall of the reflective layer.

According to some embodiments of the present invention, the structure further includes a second electrode contact extending from the conductive layer up-towards and through the first patterned current blocking layer and the second patterned current blocking layer, in which a top portion of the second electrode contact is exposed.

According to some embodiments of the present invention, the first patterned current blocking layer includes a third portion, the third portion disposed between the second electrode contact and the first electrode contact, and the conductive layer contacts with the third portion.

According to some embodiments of the present invention, the first patterned current blocking layer is made of $SiO_2$ or $Al_2O_3$, a thickness of the first patterned current blocking layer is ranged from about 1500 Å to about 3500 Å; the second patterned current blocking layer is made of $SiO_2$, $Nb_2O_5$, $Al_2O_3$, $ZrO_2$, $TiO_2$ or $MgF_2$, a thickness of the second patterned current blocking layer is ranged from about 1500 Å to about 3500 Å; and the passive layer is made of $SiO_2$, $Nb_2O_5$, $Al_2O_3$, $ZrO_2$, $TiO_2$ or $MgF_2$, a thickness of the passive layer is ranged from about 1000 Å to about 5000 Å.

According to some embodiments of the present invention, the second patterned current blocking layer and the passive layer are substantially made of a same material and the first patterned current blocking layer and the second patterned current blocking layer are made of different materials.

According to some embodiments of the present invention, the structure further includes a bonding metal layer disposed between the passive layer and the substrate.

According to various embodiments of the present invention, a method of forming flip-chip light emitting diode structure includes providing a first substrate including a first semiconductor layer, an active layer on the first semiconductor layer, a second semiconductor layer on the active layer; forming a first current blocking layer on the second semiconductor layer, in which the first current blocking layer has a plurality of interspaces; forming a reflective layer covering the interspaces, in which the reflective layer has a plurality of recesses, and each of the recesses is corresponding to each of the interspaces; and forming a second current blocking layer filling into the recesses.

According to some embodiments of the present invention, the method further includes, before forming the first current blocking layer, forming an opening penetrating the second semiconductor layer and the active layer, the opening exposing a top surface of the first semiconductor layer, a sidewall of the second semiconductor layer, and a sidewall of the active layer; and forming a transparent conductive layer on the second semiconductor layer.

According to some embodiments of the present invention, the first current blocking layer covers the sidewall of the transparent conductive layer, the sidewall of the second semiconductor layer, the sidewall of the active layer and the top surface.

According to some embodiments of the present invention, the second current blocking layer covers a sidewall of the reflective layer, and the second current blocking layer covers the first current blocking layer at the opening.

According to some embodiments of the present invention, the method further includes, after forming the second current blocking layer, forming a conductive layer covering the second current blocking layer and the reflective layer and forming a passive layer covering the conductive layer.

According to some embodiments of the present invention, the method further includes, after forming the passive layer, forming a first electrode contact at the opening, in which the first electrode contact penetrates the passive layer, the second current blocking layer and the first current blocking layer, and a bottom portion of the first electrode contact connects with the first semiconductor layer; bonding the passive layer of the first substrate to a surface of a second substrate; and forming a second electrode contact penetrating the first current blocking layer and the second current blocking layer, in which a bottom portion of the second electrode contact connects with the conductive layer, and a top portion of the second electrode contact is exposed.

BRIEF DESCRIPTION OF THE DRAWINGS

In order to make the above and other objects, features, advantages, and embodiments of the present invention more comprehensible, the detailed description of the drawings is as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The present invention provides a flip-chip light emitting diode structure with dual current blocking layers and a manufacturing method thereof. By providing dual current blocking layers, void defects generated on bonding surfaces during bonding process of the flip-chip light emitting diode structure can be reduced, and light emitting brightness of the flip-chip light emitting diode structure can be increased and the product yield can be improved.

FIGS. 1-9 illustrate each stage of the manufacturing process of a flip-chip light emitting diode structure with dual current blocking layers according to various embodiments of the present invention.

Figure 1:
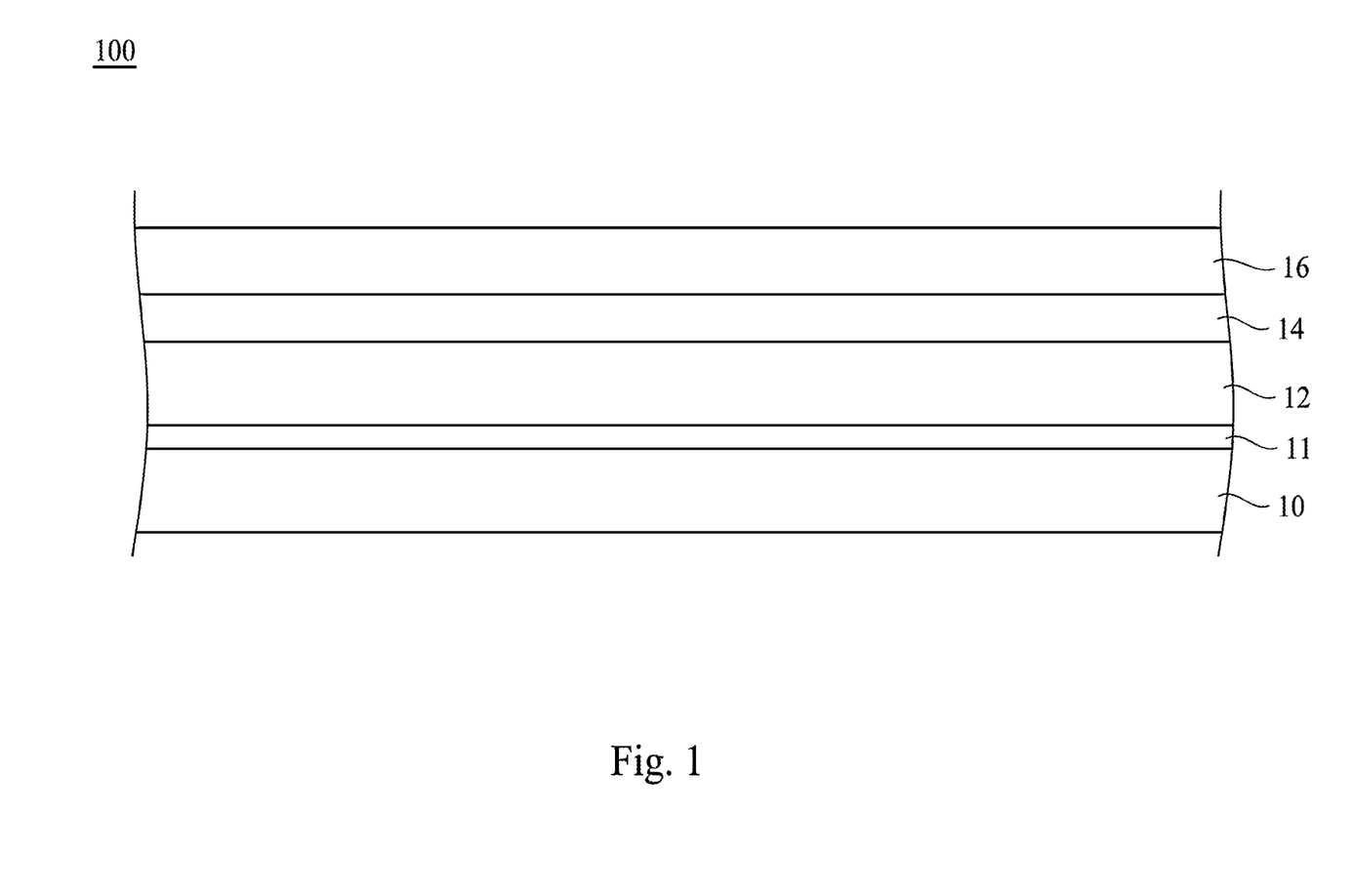
FIGS. 1-9 illustrate each stage of the manufacturing process of a flip-chip light emitting diode structure with dual current blocking layers according to various embodiments of the present invention.

Referring to FIG. 1, a first substrate 100 is provided. The first substrate 100 includes a bottom substrate 10, a first semiconductor layer 12, an active layer 14 and a second semiconductor layer 16. The first semiconductor layer 12 is disposed on the bottom substrate 10. The active layer 14 is disposed on the first semiconductor layer 12, and the second semiconductor layer 16 is disposed on the active layer 14.

In some embodiments, the bottom substrate 10 can be silicon substrate, GaN substrate, SiC substrate or sapphire substrate.

The first semiconductor layer 12 can be N-type semiconductor layer, and the second semiconductor layer 16 can be P-type semiconductor layer. However, in other embodiment, the first semiconductor layer 12 can be P-type semiconductor layer, and the second semiconductor layer 16 can be N-type semiconductor layer as long as electrical property of the first semiconductor layer 12 is different from that of the second semiconductor layer 16.

The first semiconductor layer 12 and the second semiconductor layer 16 are made of III-V compound semiconductor materials, in which III-V compound semiconductor materials can be gallium-containing nitride including gallium nitride (GaN), indium gallium nitride (InGaN), or aluminum indium gallium nitride (AlInGaN).

The active layer 14 can cope with the first and the second semiconductor layers 12 and 16, and the active layer 14 is made of gallium-containing nitride material (same as above). The active layer 14 includes homojunction, heterojunction, and single quantum well (SQW), multiple-quantum well (MQW), or other similar structures.

The first semiconductor layer 12, the active layer 14 and the second semiconductor layer 16 can be respectively formed by molecular beam epitaxy (MBE), metal organic chemical vapor deposition (MOCVD), hydride vapor phase epitaxy (HVPE), liquid phase epitaxy (LPE) or other similar process.

In some embodiments, the first substrate 100 further includes undoped-GaN (u-GaN) layer 11 disposed between the first semiconductor layer 12 and the bottom substrate 10.

Figure 2:
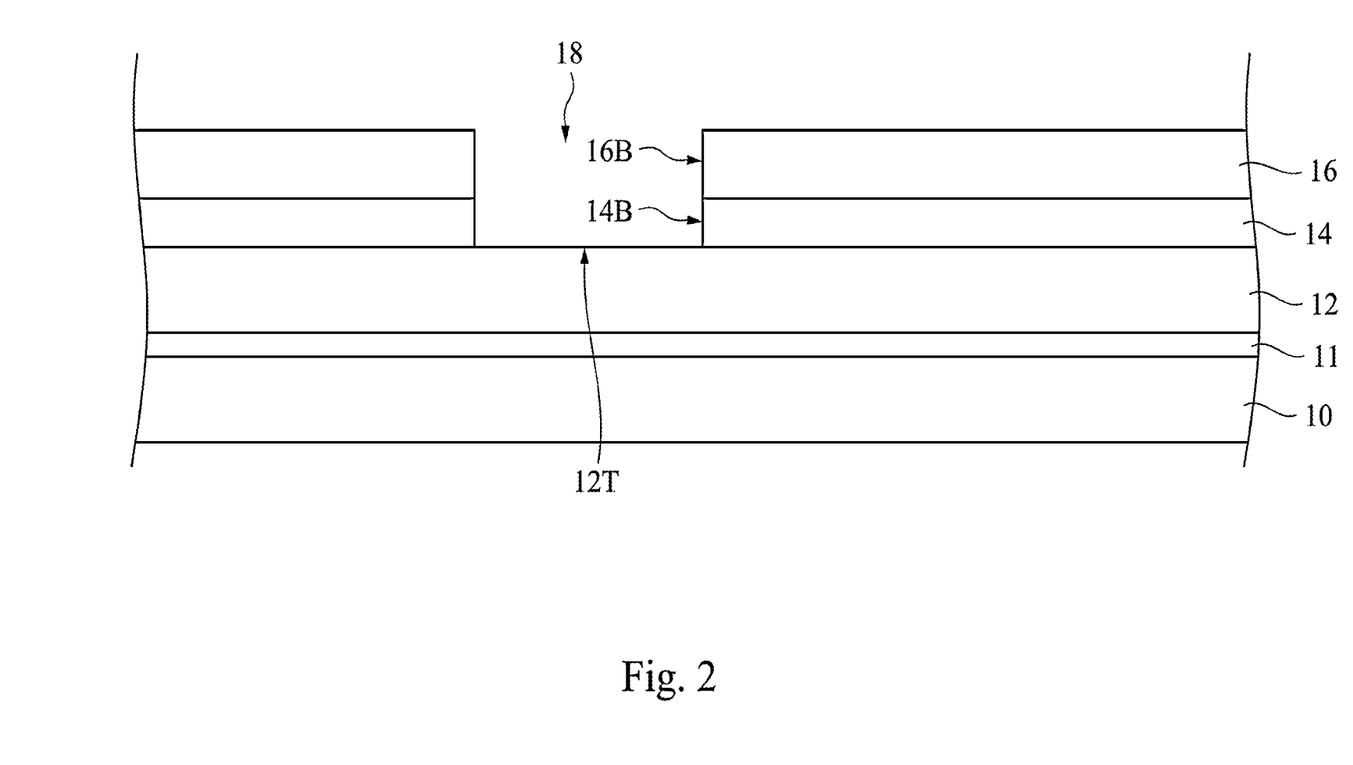

Referring to FIG. 2, an opening 18 is formed penetrating the second semiconductor layer 16 and the active layer 14. The opening 18 exposes a top surface 12T of the first semiconductor layer 12, a sidewall 16B of the second semiconductor layer 16 and a sidewall 14B of the active layer 14. The opening 18 is formed by using one or more patterning processes, such as lithography and etching. In some embodiments, the etching includes dry or wet etching.

Figure 3:
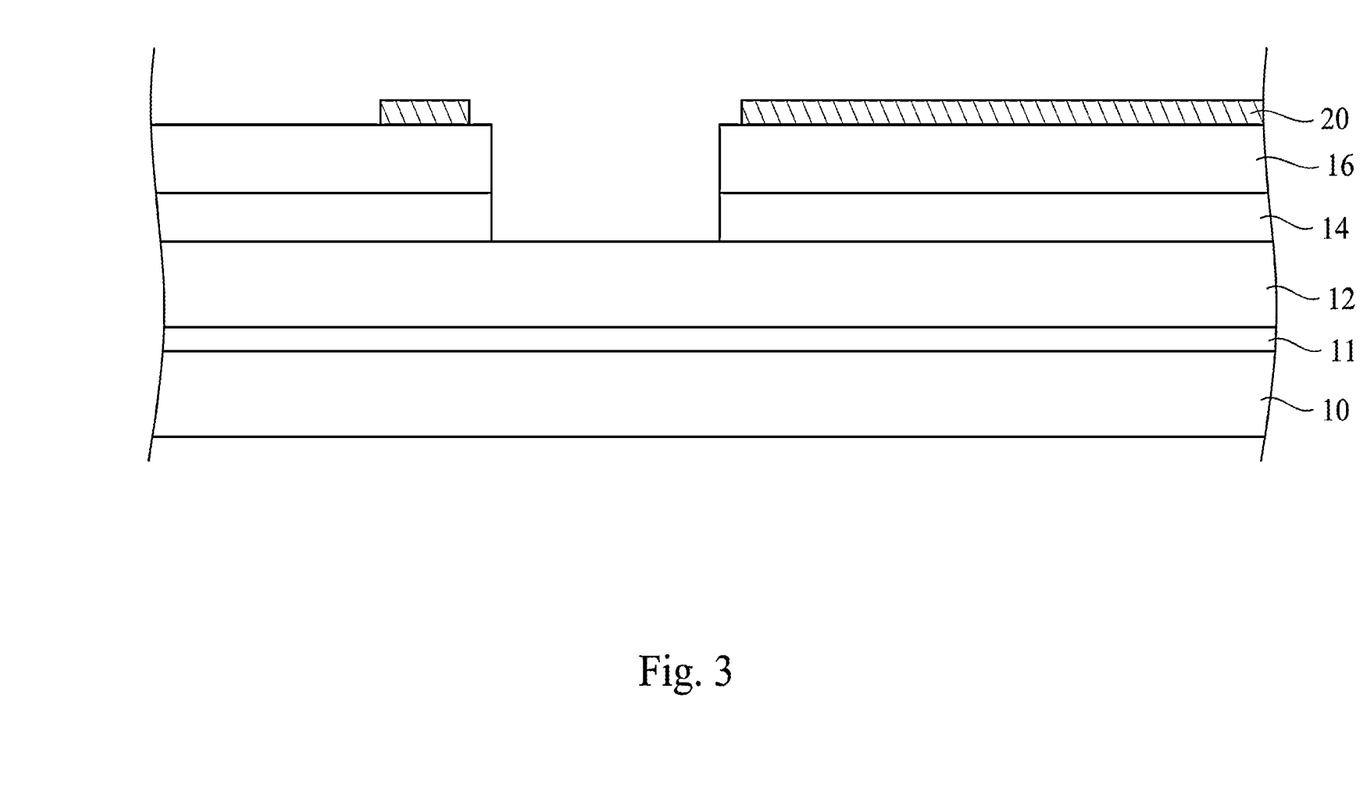

Referring to FIG. 3, a transparent conductive layer 20 is formed on the second semiconductor layer 16. In some embodiments, exemplary materials for the transparent conductive layer 20 include tin oxide (TO), indium tin oxide (ITO), indium zinc oxide (IZO), indium gallium zinc oxide (IGZO), indium tin zinc oxide (ITZO), antimony tin oxide (ATO), antimony zinc oxide (AZO), combinations thereof, or other suitable materials.

In some embodiments, the transparent conductive layer 20 may be formed by chemical vapor deposition, organic metal chemical vapor deposition, physical vapor deposition, atomic layer deposition, pulsed laser deposition, or any other suitable method.

Figure 4:
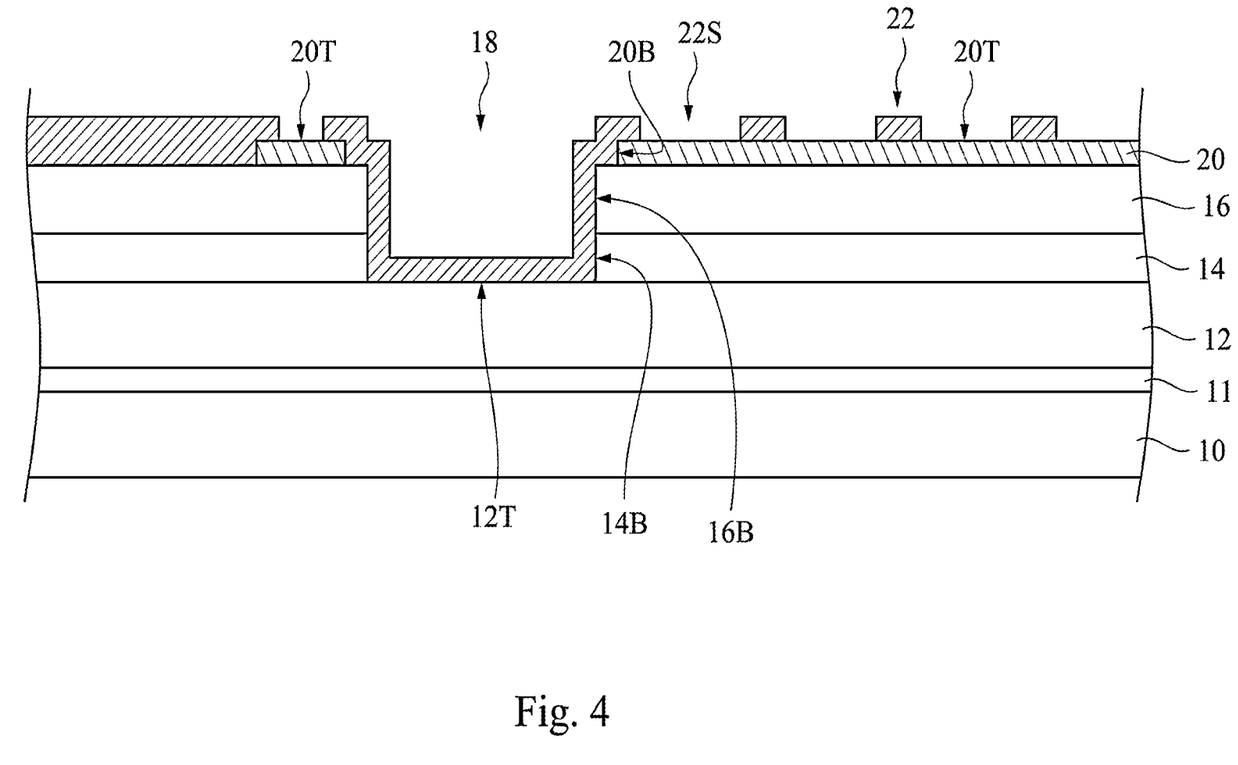

Referring to FIG. 4, a first current blocking layer 22 is formed on the second semiconductor layer 16, in which the first current blocking layer 22 has a plurality of interspaces 22S. In detail, the first current blocking layer 22 is formed on the transparent conductive layer 20 and at the opening 18, and the interspaces 22S of the first current blocking layer 22 expose top surfaces 20T of the transparent conductive layer 20.

In some embodiments, the first current blocking layer 22 covers a sidewall 20B of the transparent conductive layer 20, the sidewall 16B of the second semiconductor layer 16, the sidewall 14B of the active layer 14, and the top surface 12T of the first semiconductor layer 12 as shown in FIG. 4.

In some embodiments, the first current blocking layer 22 is made of $SiO_2$, $Nb_2O_5$, $Al_2O_3$, $ZrO_2$, $TiO_2$ or $MgF_2$. The first current blocking layer 22 can be formed by deposition or sputtering or any suitable process. In some embodiments, a thickness of the first current blocking layer 22 is in a range of about 1500 Å to about 3500 Å.

Figure 5:
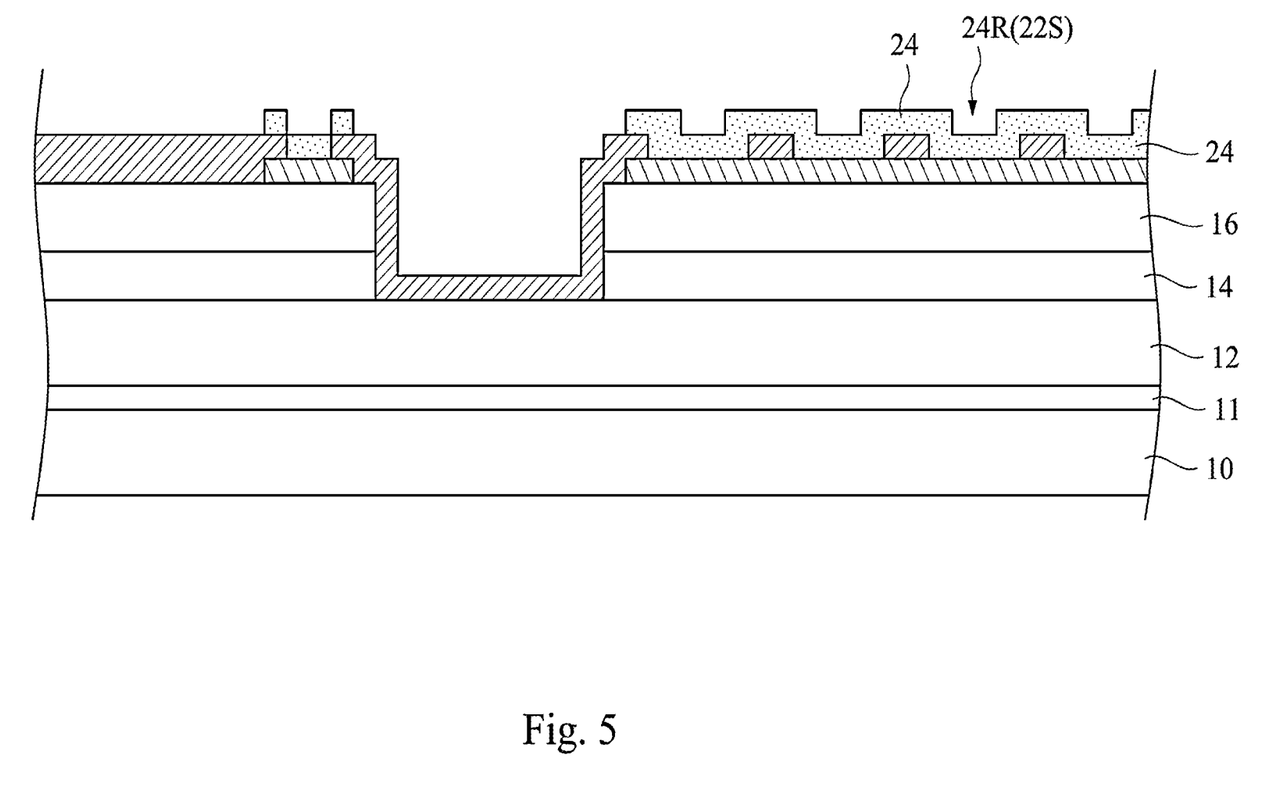

Referring to FIG. 5, a reflective layer 24 is formed on the interspaces 22S, and the reflective layer 24 has a plurality of recesses 24R and each of the recesses 24R is corresponding to each of the interspaces 22S. Further, ideally, the reflective layer 24 is formed of conductive materials. For example, the reflective layer 24 is formed of metal. In some embodiments, the material of the reflective layer 24 can be silver, aluminum, silver alloy, or combinations thereof. In some embodiments, the reflective layer 24 can essentially be used as Distributed Bragg Reflector (DBR) and can reflect light to exit the flip-chip light emitting diode structure 500 (shown in FIG. 12), thereby improving light output efficiency of the flip-chip light emitting diode structure 500.

Figure 6:
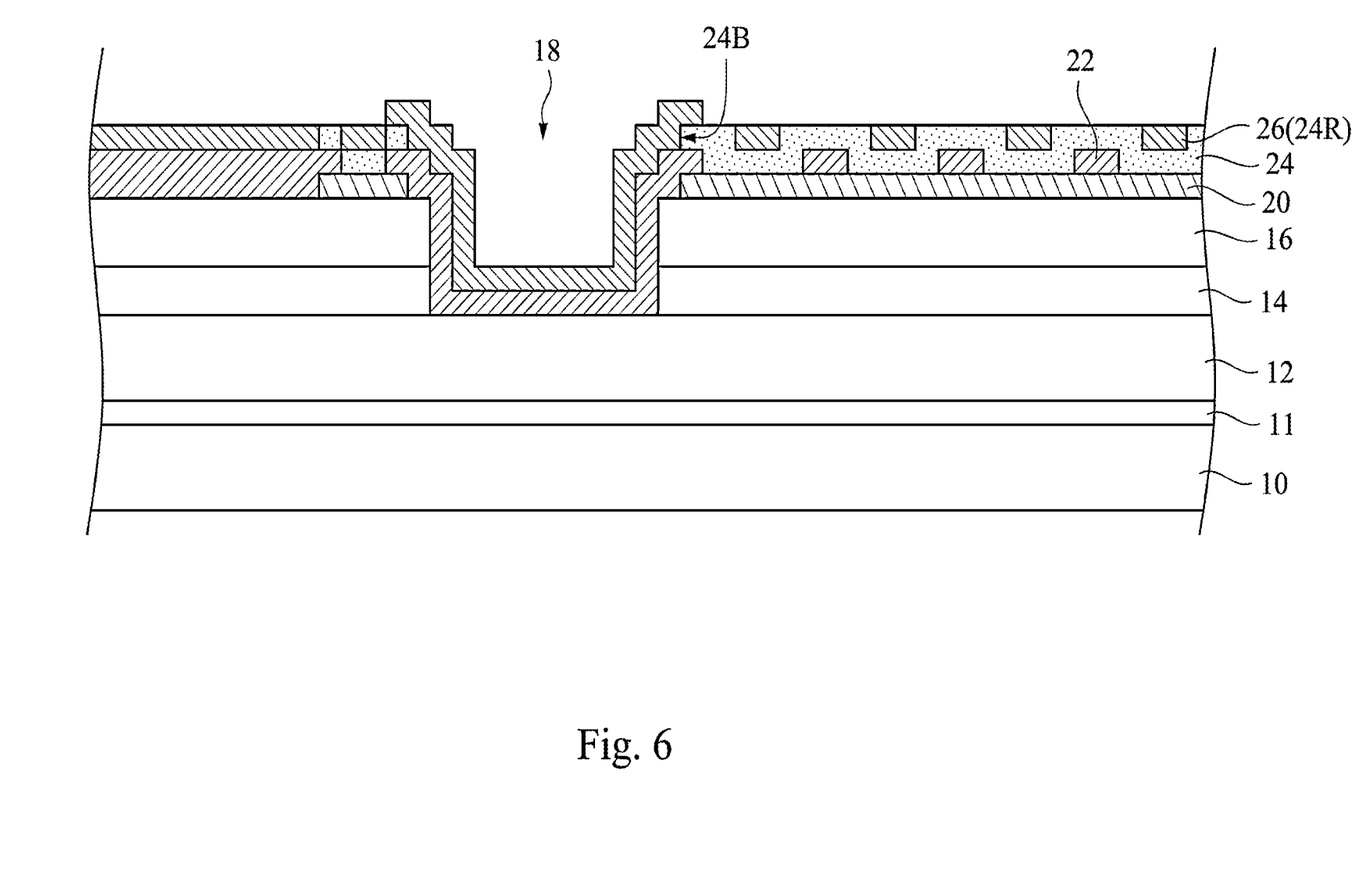

Referring to FIG. 6, a second current blocking layer 26 is formed filling into the recesses 24R. It is noted that the second current blocking layer 26 further covers a sidewall 24B of the reflective layer 24, and the second current blocking layer 26 covers the first current blocking layer 22 in conformal at the opening 18.

In some embodiments, the second current blocking layer 26 is made of $SiO_2$ or $Al_2O_3$. In some embodiments, the second current blocking layer 26 can be formed by atomic layer deposition (ALD) process. For example, the second current blocking layer 26 is deposited by using ALD process, and the second current blocking layer 26 covers the reflective layer 24 and the first current blocking layer 22 in conformal. Then, etching process is performed to remove a portion of the second current blocking layer 26 such that the top surfaces of the second current blocking layer 26 is flush with the top surfaces of the reflective layer 24. It is noted that part of the second current blocking layer 26 covers an edge of the reflective layer 24, which will be further explained later.

In some embodiments, a thickness of the second current blocking layer 26 is in a range of about 1500 Å to about 3500 Å. In some embodiments, the thickness of the second current blocking layer 26 is substantially equal to the thickness of the first current blocking layer 22. In other embodiment, the thickness of the second current blocking layer 26 is 20% or smaller to the thickness of the first current blocking layer 22. In certain embodiment, the thickness of the second current blocking layer 26 is 20% or smaller to the thickness of the reflective layer 24.

Figure 7:
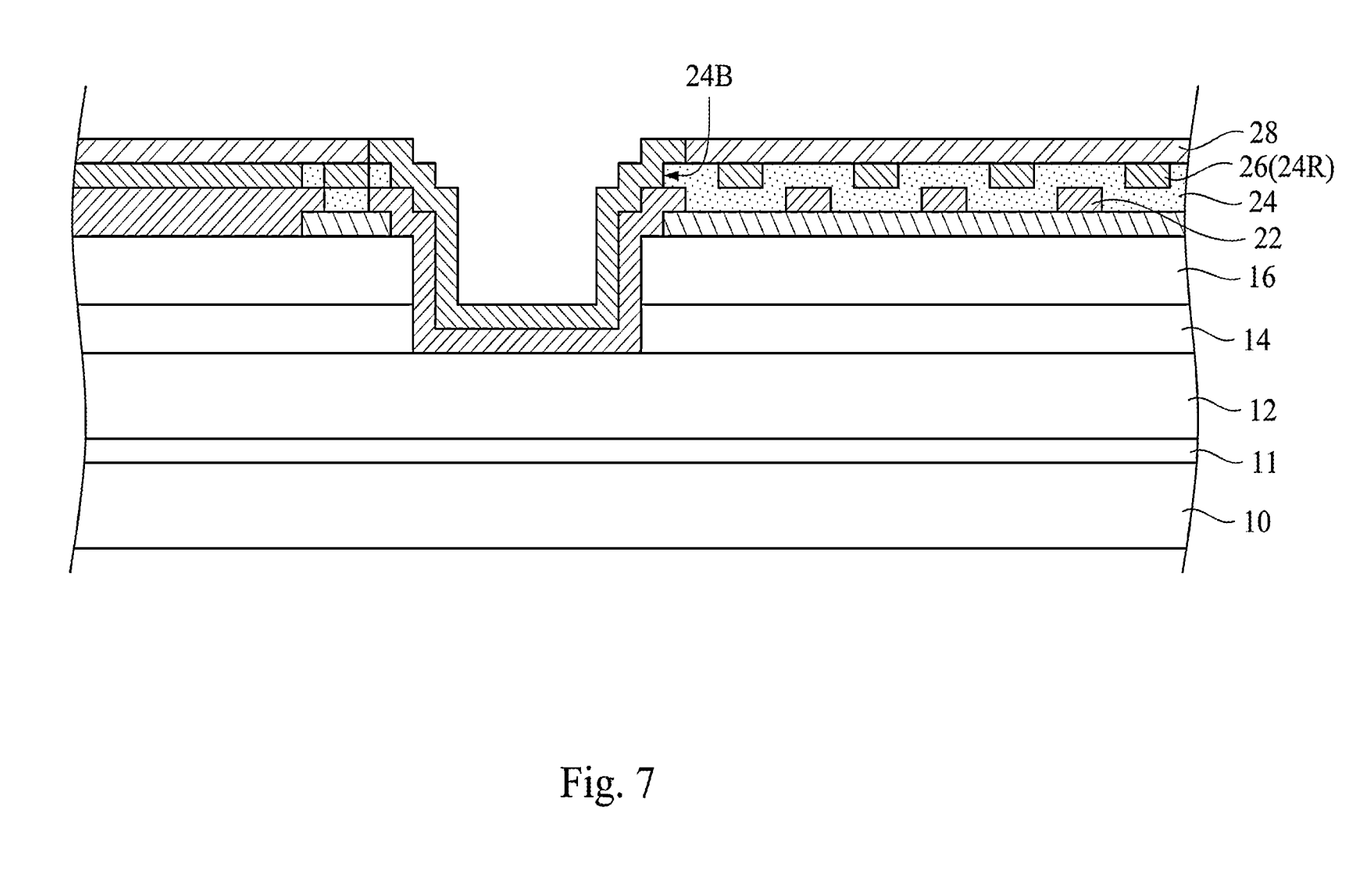

Referring to FIG. 7, a conductive layer 28 is formed covering the second current blocking layer 26 and the reflective layer 24 after forming the second current blocking layer 26. In some embodiments, the conductive layer 28 is made of metals including gold, chromium, nickel, platinum, titanium, aluminum, rhodium, combinations thereof, or other metal materials with high conductivity. In some embodiments, the conductive layer 28 can be formed by deposition or sputtering processes. In some embodiments, a planarization process is performed after forming the conductive layer 28 such that the top surface of the second current blocking layer 26 is flush with the top surface of the conductive layer 28. The planarization process includes grinding process, chemical mechanical polish (CMP), and one or more other applicable processes, or combinations thereof.

Figure 8:
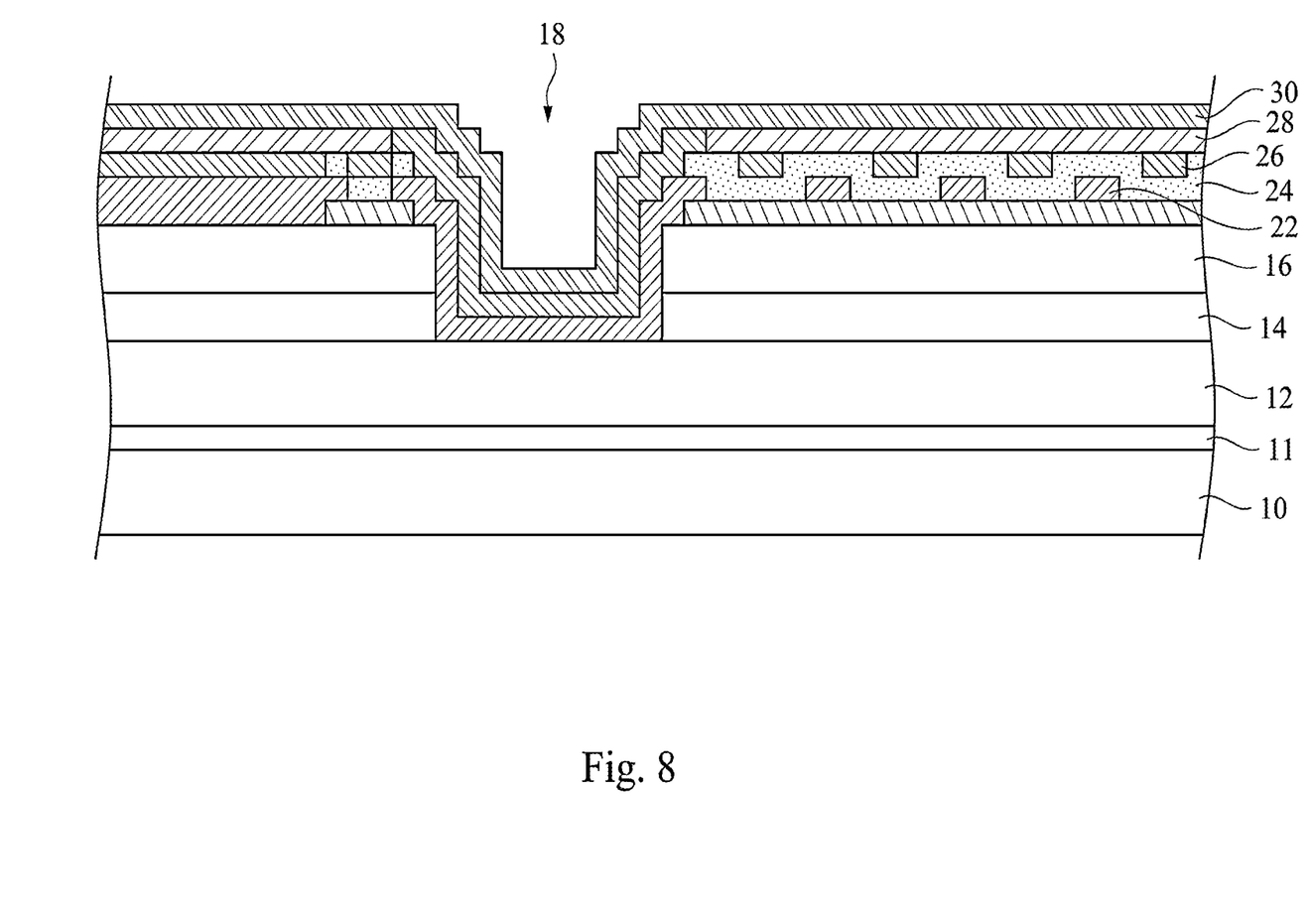

Referring to FIG. 8, after forming the conductive layer 28, a passive layer 30 is formed covering the conductive layer 28. In detail, the passive layer 30 is formed covering the conductive layer 28 and the second current blocking layer 26 in conformal. In some embodiments, the passive layer 30 is made of $SiO_2$, $Nb_2O_5$, $Al_2O_3$, $ZrO_2$, $TiO_2$ or $MgF_2$.

In some embodiments, the passive layer 30 can be formed by using deposition, sputtering or any suitable process. In some embodiments, a thickness of the passive layer 30 is in a range of about 1000 Å to about 5000 Å.

It is noted that, in some embodiments, the first current blocking layer 22 and the passive layer 30 are substantially made of a same material, and the first current blocking layer 22 and the second current blocking layer 26 are made of different materials. For examples, the first current blocking layer 22 and the passive layer 30 are substantially made of alumina, and the second current blocking layer 26 is made of silicon oxide. In other embodiments, the first current blocking layer 22 and the passive layer 30 are substantially made of silicon oxide, and the second current blocking layer 26 is made of alumina, and the thickness of the first current blocking layer 22 is substantially equal to the thickness of the second current blocking layer 26.

Figure 9:
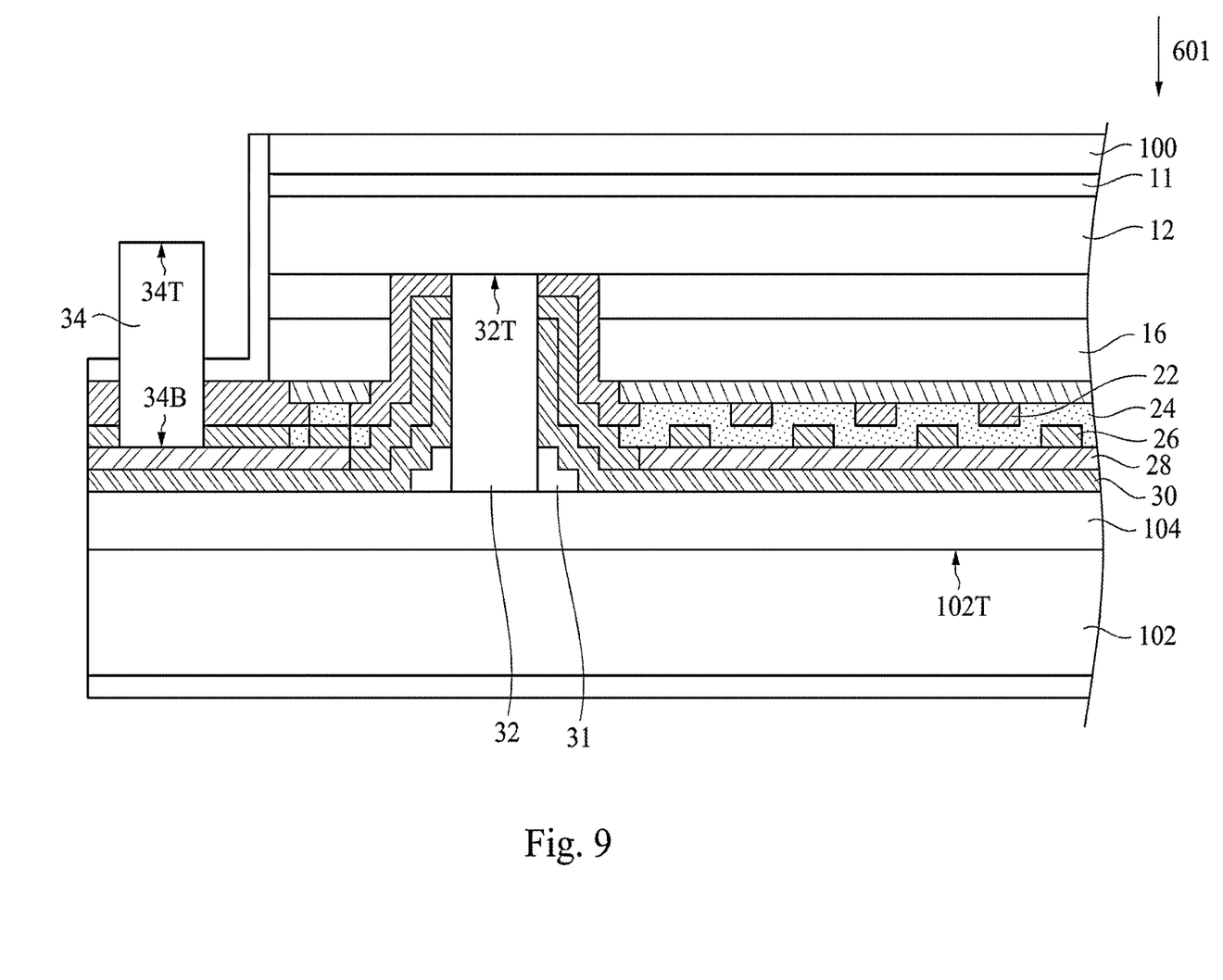

Referring to FIG. 9, the passive layer 30 of the first substrate 100 is bonded onto a second substrate 102. In detail, the passive layer 30 of the first substrate 100 is bonded onto a top surface 102T of the second substrate 102 by using a bonding metal layer 104, and thereby the bonding metal layer 104 is located between the second substrate 102 and the passive layer 30. In some embodiments, the bonding metal layer 104 is made of metal. For example, the bonding metal layer 104 is made of gold (Au), nickel (Ni), tin (Sn), indium (In), copper (Cu), or titanium (Ti).

Referring to FIG. 8 and FIG. 9, after forming the passive layer 30 and before bonding the passive layer 30 of the first substrate 100 onto the surface 102T of the second substrate 102, the first electrode contact 32 is formed at the opening 18 (shown in FIG. 9), in which the first electrode contact 32 penetrates the passive layer 30, the second current blocking layer 26 and the first current blocking layer 22, and a top portion 32T of the first electrode contact 32 connects with the first semiconductor layer 12.

In detail, referring to FIG. 8, a filling layer 31 (not shown) is firstly formed at the opening 18, and the filling layer 31 is filled into the opening 18 by using planarization process in some embodiments, such as chemical mechanical polishing. Surfaces of the filling layer 31 are flattened so that top surfaces of the filling layer 31 are flush with the top surface of the passive layer 30 located above the second semiconductor layer 16. Thereafter, the filling layer 31 is patterned by using one or more patterning processes, and the first electrode contact 32 is formed at the opening 18. Then, the bonding process between the first substrate 100 and the second substrate 102 is performed. The filling layer 31 serves not only as a flattened plane at the opening 18 but also a reflector to reflect light near sidewalls of the first electrode contact 32, and thus light output efficiency of light emitting diode structure is further enhanced.

Referring again to FIG. 9, a second electrode contact 34 is formed. The second electrode contact 34 penetrates the first current blocking layer 22 and the second current blocking layer 26, in which a bottom portion 34B of the second electrode contact 34 connects with the conductive layer 28, and a top portion 34T of the second electrode contact 34 is exposed.

In some embodiments, the first and the second electrode contacts 32 and 34 can be formed by deposition and patterning processes and made of materials including gold, chromium, nickel, platinum, titanium, aluminum, rhodium, a combination of the above, or other conductive metal materials.

Referring again to FIG. 7, the first current blocking layer 22, the reflective layer 24 and the second current blocking layer 26 are formed firstly; thereafter, the conductive layer 28 is formed covering the second current blocking layer 26 and the reflective layer 24. It is noted that forming the second current blocking layer 26 filling into the recesses 24R of the reflective layer 24 provides effects described below.

The second current blocking layer 26 located between the reflective layer 24 and the conductive layer 28 is to reduce current crowding effect and increase conduction of current in the conductive layer 28; thereby light emitting brightness of light emitting diode structure is improved.

The second current blocking layer 26 provides protection for the reflective layer 24. When patterning the conductive layer 28, the reflective layer 24 is easily damaged due to an area of the reflective layer 24 is substantially larger than that of the conductive layer 28, for example, the reflective layer 24 is lifted from its edge area. By covering the sidewall 24B of the reflective layer 24 with the second current blocking layer 26, the edges of the reflective layer 24 are protected, thereby improving the overall yield in terms of electrical property.

The second current blocking layer 26 is filled into the recesses 24R of the reflective layer 24, and the second current blocking layer 26 together with the reflective layer 24 provide a flat plane for forming the conductive layer 28, and the conductive layer 28 can be thus formed flatter without surface depressions that are conformal with the recesses 24R. The passive layer 30 is formed on the conductive layer 28 is also relatively flatter. In the subsequent bonding process, formation of the void defects can be reduced between the passive layer 30 and the second substrate 102; thereby the process stability and the yield of the structure appearance are improved.

Figure 10A:
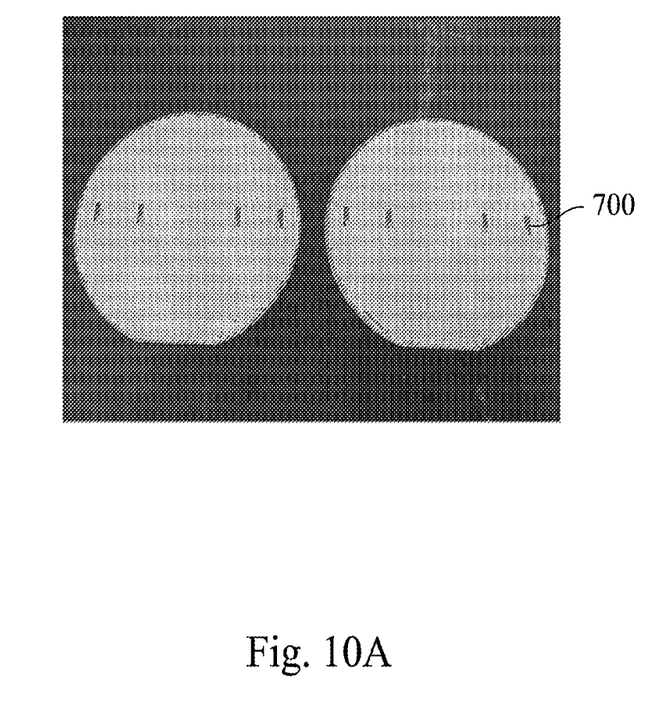
FIG. 10A is a photograph of a flip-chip light emitting diode structure with dual current blocking layers according to various embodiments of the present invention.
Figure 10B:
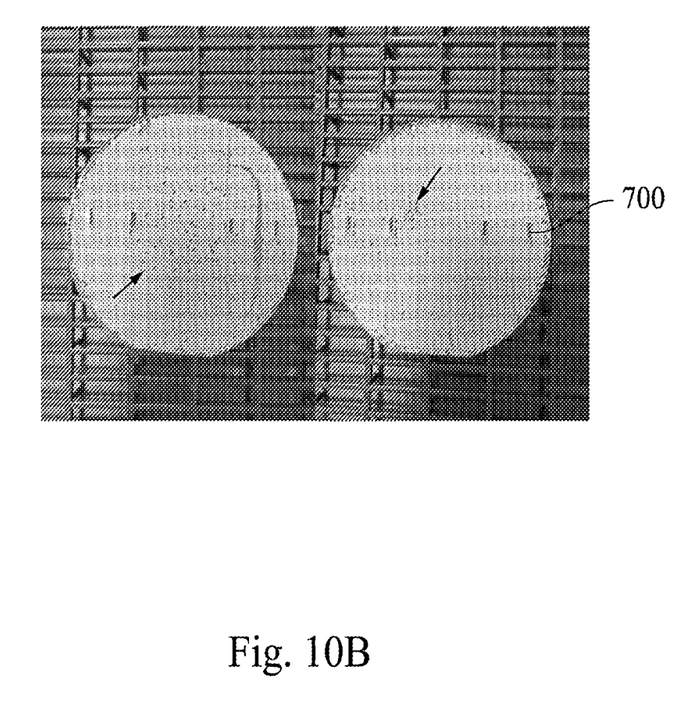
FIG. 10B is a photograph of a flip-chip light emitting diode structure without dual current blocking layers.

FIG. 10A is a photograph of a flip-chip light emitting diode structure with dual current blocking layers according to various embodiments of the present invention. FIG. 10B is a photograph of a flip-chip light emitting diode structure without dual current blocking layers.

In detail, FIG. 10A and FIG. 10B show photographs viewed from a direction 601 in FIG. 9. As shown in FIG. 10B, the surface of the flip-chip light emitting diode structure without dual current blocking layers includes four alignment marks 700 after bonding, and there are many appearance defects (ex, at the arrow), which are aforementioned void defects formed between the passive layer 30 and second the substrate 102. The number of appearance defects of the flip-chip light emitting diode structure with dual current blocking layers according to various embodiments of the present invention is significantly reduced as shown in FIG. 10A.

Table 1 shows turn-on voltage and process yield of the flip-chip light emitting diode structure:

|  |  | Turn-on Voltage (V) | Process Yield |
|---|---|---|---|
| Product A | Example 1 | 2.6 | 77.43% |
|  | Comparative Example 1 | 2.36 | 75.22% |
| Product B | Examples 2 | 2.5 | 71.07% |
|  | Comparative Example 2 | 2.38 | 69.03% |

As shown in Table 1, in the design of product A, Example 1 of flip-chip light emitting diode structure with dual current blocking layers can provide higher turn-on voltage and has higher process yield than that of Comparative Example 1 of flip-chip light emitting diode structure without dual current blocking layers. In the design of product B, Example 2 also provides higher turn-on voltage and has higher process yield than those of Comparative Example 2.

Figure 11:
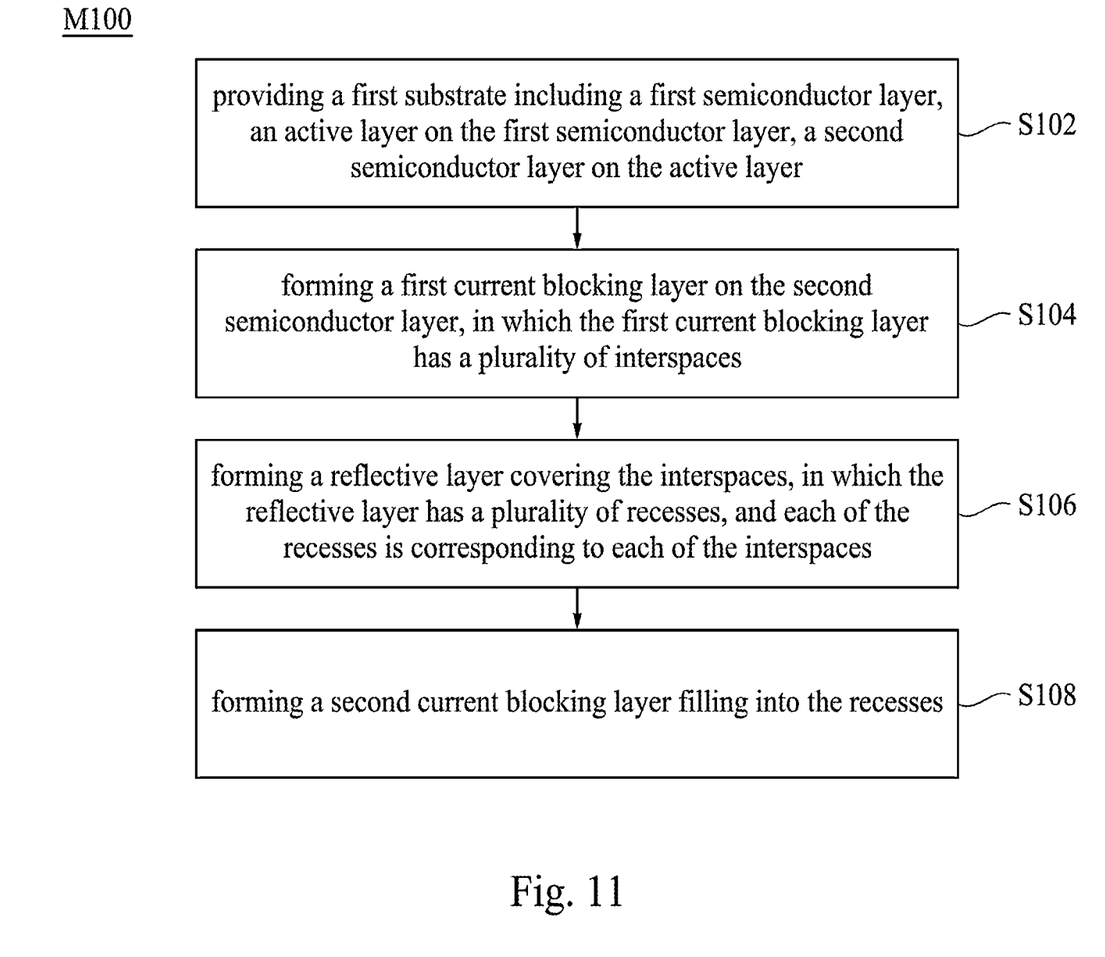
FIG. 11 is a flowchart of manufacturing method of flip-chip light emitting diode structure with dual current blocking layers according to various embodiments of the present invention.

FIG. 11 is a flowchart of manufacturing method of flip-chip light emitting diode structure with dual current blocking layers according to various embodiments of the present invention. Method M100 includes operation S102, operation S104, operation S106 and operation S108.

Method M100 begins with operation S102, the first substrate 100 is provided as shown in FIG. 1. The first substrate 100 includes the first semiconductor layer 12, the active layer 14 on the first semiconductor layer 12, and the second semiconductor layer 16 on the active layer 14. Method M100 further includes forming the opening 18 penetrating the second semiconductor layer 16 and the active layer 14, the opening 18 exposing the top surface 12T of the first semiconductor layer 12, the sidewall 16B of the second semiconductor layer 16, the sidewall 14B of the active layer 14, and forming the transparent conductive layer 20 on the second semiconductor layer 16 as shown in FIG. 3. Operation S102 is followed by operation S104, the first current blocking layer 22 is formed on the second semiconductor layer 16, in which the first current blocking layer 22 has a plurality of interspaces 22S as shown in FIG. 4. Operation S104 is followed by operation S106, the reflective layer 24 is formed covering the interspaces 22S, in which the reflective layer 24 has a plurality of recesses 24R, each of the recesses 24R is corresponding to each of the interspaces 22S as shown in FIG. 5. Operation S106 is followed by operation S108, the second current blocking layer 26 is formed filling into the recesses 24R as shown in FIG. 6.

Method M100 further includes forming the conductive layer 28 covering the second current blocking layer 26 and the reflective layer 24, and forming the passive layer 30 covering the conductive layer 28 after forming the second current blocking layer 26 as shown in FIG. 7 and FIG. 8.

Method M100 further includes forming the first electrode contact 32 at the opening 18, in which the first electrode contact 32 penetrates the passive layer 30, the second current blocking layer 26 and the first current blocking layer 22, and the top portion 32T of the first electrode contact 32 connects with the first semiconductor layer 12 after forming the passive layer 30; bonding the passive layer 30 of the first substrate 100 onto the surface 102T of the second substrate 102; and forming the second electrode contact 34 penetrating through the first current blocking layer 22 and the second current blocking layer 26, in which the bottom portion 34B of the second electrode contact 34 connects with the conductive layer 28, and the top portion 34T of the second electrode contact 34 is exposed as shown in FIG. 9.

Figure 12:
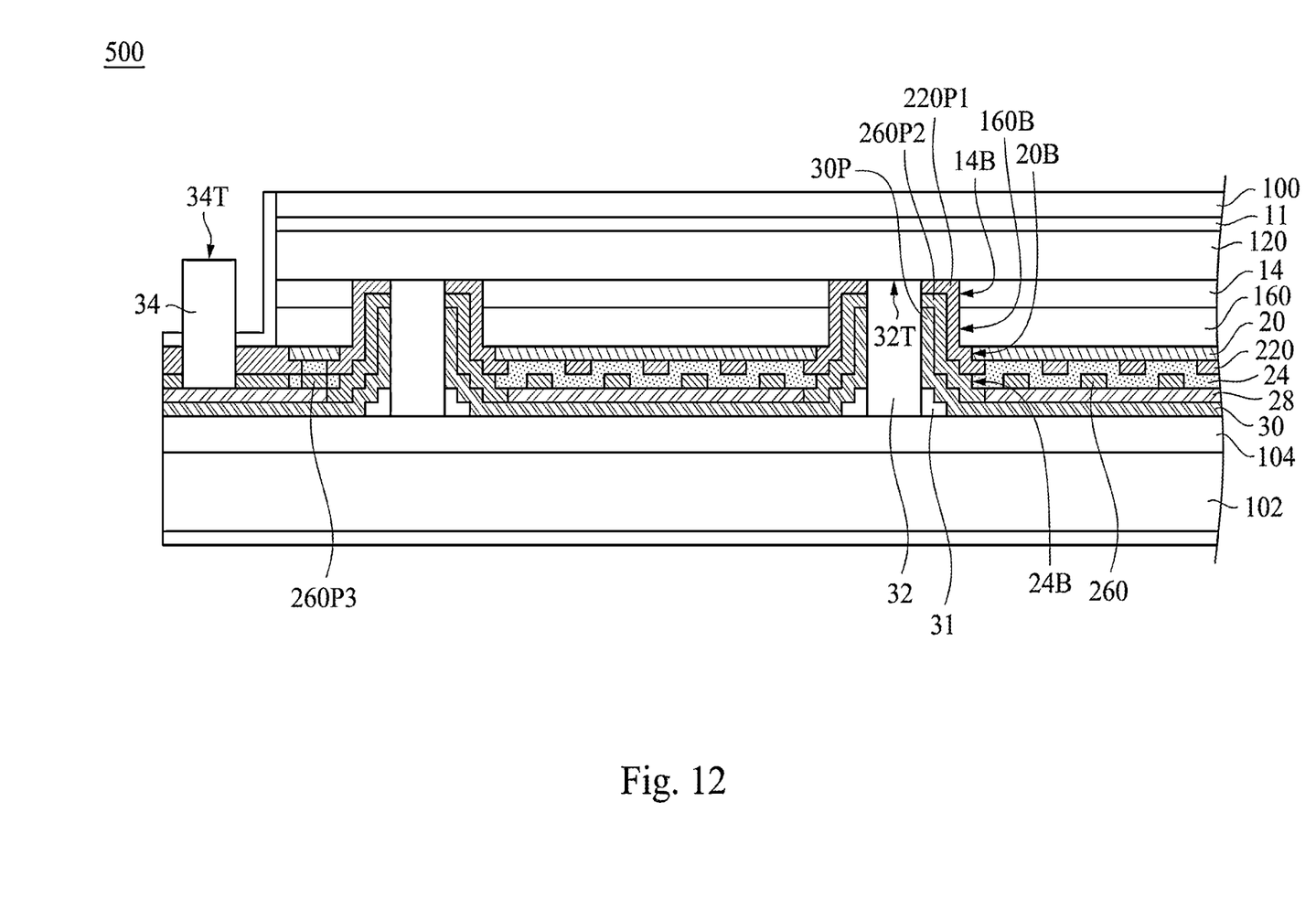
FIG. 12 illustrates flip-chip light emitting diode structure with dual current blocking layers according to various embodiments of the present invention.

FIG. 12 illustrates a flip-chip light emitting diode structure 500 with dual current blocking layers according to various embodiments of the present invention.

Referring to FIG. 12, the flip-chip light emitting diode structure 500 with dual current blocking layers according to various embodiments of the present invention includes a substrate 102, a first patterned current blocking layer 260, a second patterned current blocking layer 220, a first semiconductor layer 160, an active layer 14 and an second semiconductor layer 120.

The first patterned current blocking layer 260 is disposed on the substrate 102, and the second patterned current blocking layer 220 is disposed on the first patterned current blocking layer 260. It is noted that the first patterned current blocking layer 260 and the second patterned current blocking layer 220 are located on different planes, and patterns of the first patterned current blocking layer 260 and patterns of the second patterned current blocking layer 220 are substantially complementary as shown in FIG. 12.

In some embodiments, the first semiconductor layer 160 is disposed on the second patterned current blocking layer 220, the active layer 14 is disposed on the first semiconductor layer 160, and the second semiconductor layer 120 is disposed on the active layer 14 as shown in FIG. 12.

The flip-chip light emitting diode structure 500 with dual current blocking layers according to various embodiments of the present invention further includes a transparent conductive layer 20. The transparent conductive layer 20 is disposed between the first semiconductor layer 160 and the second patterned current blocking layer 220 as shown in FIG. 12.

The flip-chip light emitting diode structure 500 with dual current blocking layers according to various embodiments of the present invention further includes a first electrode contact 32. The first electrode contact 32 is disposed on the substrate 102 and penetrates the first patterned current blocking layer 260, the second patterned current blocking layer 220, the transparent conductive layer 20, the first semiconductor layer 160 and the active layer 14, in which a top portion 32T of the first electrode contact 32 is contacted with the second semiconductor layer 120 as shown in FIG. 12.

In some embodiments, the second patterned current blocking layer 220 includes a first portion 220P1 extending towards the second semiconductor layer 120, and covering a sidewall 20B of the transparent conductive layer 20, a sidewall 160B of the first semiconductor layer 160, and a sidewall 14B of the active layer 14 as shown in FIG. 12.

In some embodiments, the first patterned current blocking layer 260 includes a second portion 260P2 extending towards the second semiconductor layer 120, and covering the first portion 220P1, in which the second portion 260P2 is substantially conformal with the first portion 220P1 as shown in FIG. 12. The first electrode contact 32 is separated at least by the first portion 220P1 and the second portion 260P2 from the transparent conductive layer 20, the first semiconductor layer 160 and the active layer 14.

The flip-chip light emitting diode structure 500 with dual current blocking layers according to various embodiments of the present invention further includes a passive layer 30. The passive layer 30 is disposed between the substrate 102 and the first patterned current blocking layer 260, and a portion 30P of the passive layer 30 is interposed between the first electrode contact 32 and the second portion 260P2 as shown in FIG. 12.

The flip-chip light emitting diode structure 500 with dual current blocking layers according to various embodiments of the present invention further includes a conductive layer 28 and a reflective layer 24. The conductive layer 28 is disposed between the first patterned current blocking layer 260 and the substrate 102 as shown in FIG. 12. The reflective layer 24 is disposed between the transparent conductive layer 20 and the conductive layer 28, in which the first patterned current blocking layer 260 and the second patterned current blocking layer 220 are embedded in the reflective layer 24, and the first patterned current blocking layer 260 contacts with the conductive layer 28, the second patterned current blocking layer 220 contacts with the transparent conductive layer 20.

In some embodiments, the second portion 260P2 further covers the sidewall 24B of the reflective layer 24 as shown in FIG. 12.

The flip-chip light emitting diode structure 500 with dual current blocking layers according to various embodiments of the present invention further includes a second electrode contact 34. The second electrode contact 34 is extended from the conductive layer 28 up-towards and through the first patterned current blocking layer 260 and the second patterned current blocking layer 220, and a top portion 34T of the second electrode contact 34 is exposed as shown in FIG. 12.

In some embodiments, the first patterned current blocking layer 260 includes a third portion 260P3, the third portion 260P3 is disposed between the second electrode contact 34 and the first electrode contact 23, and the conductive layer 28 contacts with the third portion 260P3.

The flip-chip light emitting diode structure 500 with dual current blocking layers according to various embodiments of the present invention further includes a bonding metal layer 104. The bonding metal layer 104 is disposed between the passive layer 30 and the substrate 102 as shown in FIG. 12.

In summary, the present disclosure applying dual current blocking layers in flip-chip light emitting diode structure provides reduction of the void defects occurring in the bonding process of the flip-chip light emitting diode structure and increase of brightness and product yield of flip-chip light emitting diode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming flip-chip light emitting diode structure, comprising:
   providing a first substrate including a first semiconductor layer, an active layer on the first semiconductor layer, a second semiconductor layer on the active layer;
   forming a first current blocking layer on the second semiconductor layer, wherein the first current blocking layer has a plurality of interspaces;
   forming a reflective layer covering the interspaces, wherein the reflective layer has a plurality of recesses, and each of the recesses is corresponding to each of the interspaces; and
   forming a second current blocking layer filling into the recesses.

2. The method of claim 1, wherein before forming the first current blocking layer, further comprising:
   forming an opening penetrating the second semiconductor layer and the active layer, the opening exposing a top surface of the first semiconductor layer, a sidewall of the second semiconductor layer, and a sidewall of the active layer; and
   forming a transparent conductive layer on the second semiconductor layer.

3. The method of claim 2, wherein the first current blocking layer covering the sidewall of the transparent conductive layer, the sidewall of the second semiconductor layer, the sidewall of the active layer, and the top surface.

4. The method of claim 3, wherein the second current blocking layer covers a sidewall of the reflective layer, and the second current blocking layer covers the first current blocking layer at the opening.

5. The method of claim 1, wherein after forming the second current blocking layer, further comprising:
   forming a conductive layer covering the second current blocking layer and the reflective layer; and
   forming a passive layer covering the conductive layer.

6. The method of claim 5, wherein after forming the passive layer, further comprising:
   forming a first electrode contact at an opening, wherein the first electrode contact penetrates the passive layer, the second current blocking layer and the first current blocking layer, and a bottom portion of the first electrode contact connects with the first semiconductor layer;
   bonding the passive layer of the first substrate to a surface of a second substrate; and
   forming a second electrode contact penetrating the first current blocking layer and the second current blocking layer, wherein a bottom portion of the second electrode contact connects with the conductive layer, and a top portion of the second electrode contact is exposed.

* * * * *